US007746009B2

(12) United States Patent
Held et al.

(10) Patent No.: US 7,746,009 B2
(45) Date of Patent: Jun. 29, 2010

(54) OPERATING LAMP CONTROLS

(75) Inventors: Fred Held, Hamburg (DE); Kamran Tahbazian, Groebenzell (DE); Rudolf Marka, Ismauing (DE)

(73) Assignee: Trumpf Medizin Systeme GmbH + Co. KG, Puchheim (DE)

(*) Notice: Subject to any disclaimer, the term of this patent is extended or adjusted under 35 U.S.C. 154(b) by 302 days.

(21) Appl. No.: 11/459,689

(22) Filed: Jul. 25, 2006

(65) Prior Publication Data

US 2007/0030702 A1 Feb. 8, 2007

(30) Foreign Application Priority Data

Aug. 6, 2005 (EP) ................................ 05017160

(51) Int. Cl.
*H05B 37/02* (2006.01)
*H05K 7/14* (2006.01)

(52) U.S. Cl. ....................... 315/362; 362/285; 362/800; 362/802

(58) Field of Classification Search ............. 315/209 R, 315/291, 312, 185 S, 210, 226, 307, 316, 315/361, 362; 362/800, 238, 249.1–249.07, 362/249.12, 285, 295, 319, 802, 806
See application file for complete search history.

(56) References Cited

U.S. PATENT DOCUMENTS 3,375,362 A 3/1968 Klippert
4,196,460 A 4/1980 Schreckendgust
5,383,105 A * 1/1995 Agut .......................... 362/285
5,497,295 A 3/1996 Gehly
5,526,245 A 6/1996 Davis et al.
6,004,005 A 12/1999 Demshki
6,402,351 B1 6/2002 Borders et al.
6,488,390 B1 * 12/2002 Lebens et al. ............... 362/231
6,513,962 B1 * 2/2003 Mayshack et al. ........... 362/583
6,585,395 B2 * 7/2003 Luk ...................... 362/249.02
6,603,271 B2 * 8/2003 Noh ........................ 315/185 S
6,633,328 B1 10/2003 Byrd et al.
6,778,226 B1 * 8/2004 Eshelman et al. ........... 348/836
6,863,417 B2 3/2005 Hill
6,863,422 B2 3/2005 Jesurun et al.
2002/0089857 A1 7/2002 Borders et al.

(Continued)

FOREIGN PATENT DOCUMENTS

DE 9217573 8/1993

(Continued)

OTHER PUBLICATIONS

Berchtold Gruppe, "Kamera Vorstellung von neuer OP-Leuchte", Granzbote-Heubergerbote-Trossing Zeitung, Image 1, 2002.

(Continued)

*Primary Examiner*—Douglas W Owens
*Assistant Examiner*—Jimmy T Vu
(74) *Attorney, Agent, or Firm*—Fish & Richardson P.C.

(57) ABSTRACT

An operating lamp has operator controls that include several operating parameter display fields for displaying adjustable parameters of operating states of the operating lamp, and a control element, such as a manipulable knob, for setting those parameters. The same control element also emits control signals for changing the operating state.

20 Claims, 3 Drawing Sheets

U.S. PATENT DOCUMENTS

| | | | |
|---|---|---|---|
| 2002/0191389 A1 | 12/2002 | Hill | |
| 2003/0146719 A1 | 8/2003 | Laerum et al. | |

FOREIGN PATENT DOCUMENTS

| | | |
|---|---|---|
| DE | 1981984 | 9/1999 |
| DE | 29920746 | 4/2000 |
| EP | 125 1722 | 10/2002 |
| EP | 1251722 | 10/2002 |
| WO | WO 01/69130 | 9/2001 |
| WO | WO 03/072995 | 9/2003 |

OTHER PUBLICATIONS

Derungs_DAI, Internet Archive, "Way Back Machine" http:dali-ag.org, http://www.archive.org/index.php, 11 pages, 2008.

"Internet chess server-Wikipedia, the free encyclopedia", http://en.wikipedia.org/wiki/Internet_chess_server, pp. 1-3, 2008. Translation.

Dr. Mach, "A Step Into New Dimensions", www.dr-mach.com, pp. 1-3. Translation.

Dr. Mach, "Single Operating Theatre Lamps", www.dr-mach.com, pp. 1-3. Translation.

Schlichter, J. et al., "Computer Supported Cooperative Work (CSCW)", *i-com*, ISSN1618-162X, pp. 5-11, 2001. English summary.

International Search Report from PCT Application No. PCT/EP2006/010914, mailed Jan. 24, 2007, 6 pages.

Notification of Transmittal of Copies of Translation of the International Preliminary Report on Patentability for PCT Application No. PCT/EP2006/010914, mailed Jun. 19, 2008, 6 pages.

* cited by examiner

OPERATING LAMP CONTROLS

RELATED APPLICATION

Under 35 U.S.C. § 119, this application claims the benefit of a foreign priority application filed in Europe, serial number EP 05 017 160.2, filed Aug. 6, 2005, the entire contents of which are hereby incorporated by reference.

BACKGROUND

The invention relates to an operating lamp with operator controls having several operating parameter display fields for displaying adjustable parameters of operating states of the operating lamp, and a control element for setting the parameters.

The use of operating lamps of this type in operating rooms is generally known.

Advantageously, the operating surgeon can easily access the operator controls to facilitate handling of the operating lamp.

It is desired to further facilitate handling of the operating lamp.

SUMMARY

One aspect of the invention features an operating lamp of the above-mentioned type, in which the control element also emits control signals for changing the operating state. Advantageously, the operating surgeon can switch between operating states using one single control element, and change the parameters of the operating state.

In a technical implementation of the functions of the control element, the control signals for setting the operating parameters are emitted by moving the control element in a different direction than for emitting control signals for changing the operating state. One direction of motion may be, for example, a rotation and the other direction of motion may be, for example, an axial displacement.

In order to provide optimum access to the operator controls, the operator controls may be disposed in the region of the illuminants or the light modules or in the region of the mounting means of the operating lamp.

The adjustable operating states may advantageously include: light intensity, emitted color temperature, distribution of the light intensities at the light emitting surface, on or off.

Cleaning of the control element is facilitated in embodiments in which the control element of the operator controls can be removed.

When the control element of the operator controls can be sterilized, the operating surgeon can use the control element also during an operation.

The details of one or more embodiments of the invention are set forth in the accompanying drawings and the description below. Other features, objects, and advantages of the invention will be apparent from the description and drawings, and from the claims.

DESCRIPTION OF DRAWINGS

The schematic drawing shows two preferred embodiments of the invention which are explained with reference to the drawing.

Like reference symbols in the various drawings indicate like elements.

DETAILED DESCRIPTION

Figure 1:
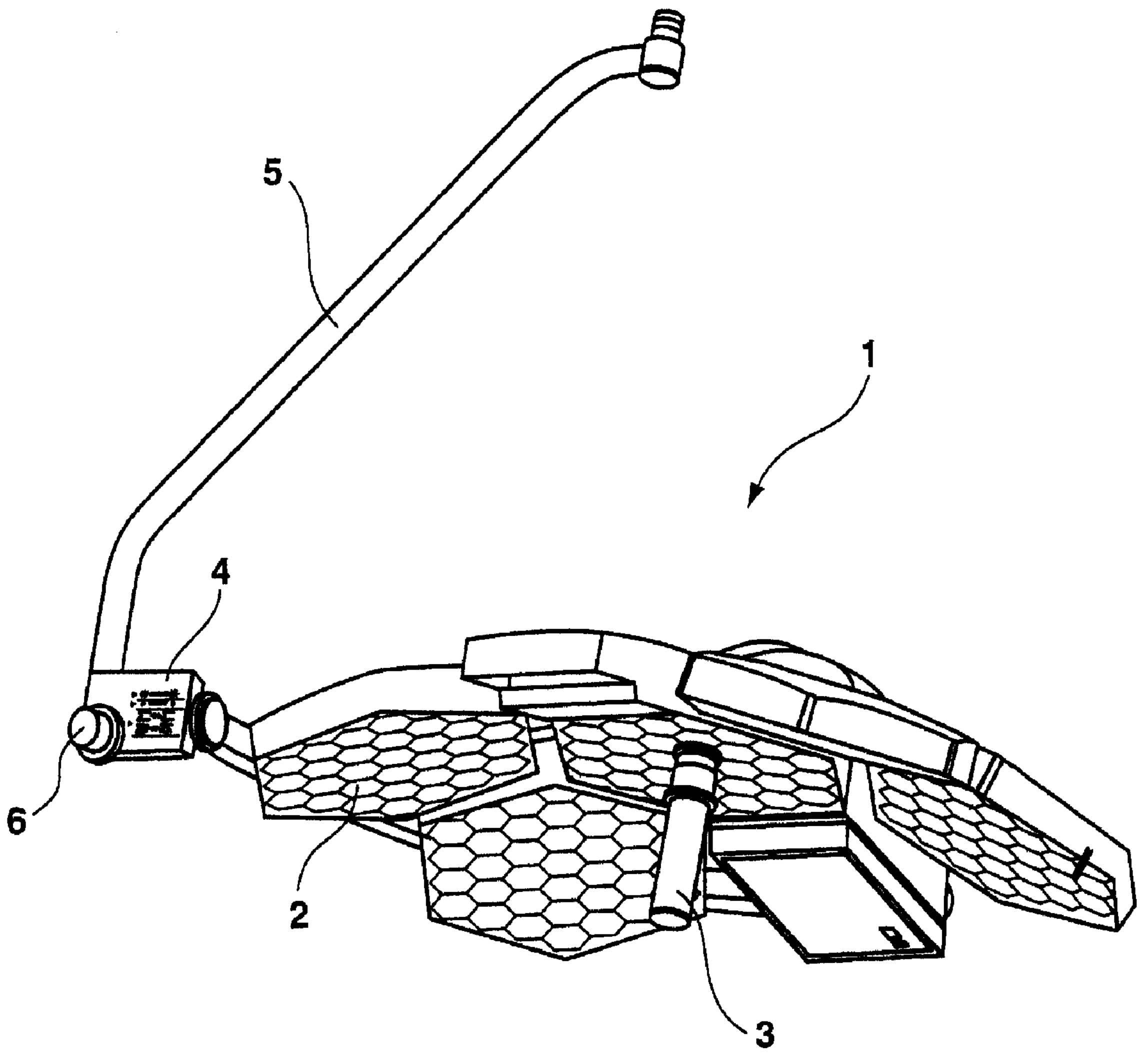
FIG. 1 shows a first operating lamp.

In accordance with FIG. 1, an operating lamp 1 includes several light modules 2, a handle 3 and operator controls 4. The light modules 2 are connected to a pivot arm 5 of a support via a carrier, and the support may be mounted to a ceiling or wall. The light modules 2 are controlled by the operator controls 4 which are mounted to the pivot arm 5. Optionally, additional operator controls may be provided which may be built into the wall of the operating room, for example. Activation is implemented by using any of the operator controls. The display of the respective operating states and parameters is identical. The operator controls 4 comprise an control element 6 which permits switching over between the individual operating states of the operating lamp 1 and also changing of the parameters within the operating states. The control element 6 can be displaced in an axial direction in accordance with the double arrow in order to switch between the operating states. In order to change the parameters, the control element 6 can be turned (displacement and turning of the control element see FIG. 3).

The control element 6 is formed by a push button or rotary switch which can be removed and sterilized, and which emits pulses to the control of the operating lamp 1 upon exertion of pressure or rotation. When the control element 6 is pressed, the different operating states of the operating lamp 1 are switched one after the other. The operating states involve the following functions:

on/off (completely switched off or standby state)
light intensity (brightness)
color temperature
illumination situation (selection of the intensity distribution of the emitted light
optional: camera control (orientation, zoom)

The defined stepped rotation of the control element 6 is facilitated through lock-in positions of the rotary switch. The operating parameters may be changed during one operating state and be displayed on the operator controls 4. The following parameters are stored in a control:

Light intensity: e.g. endo (10%)/50%/60%/70%/80%/90%/100%
Color temperature: e.g. 3500 K/4000K/4500 K/5000 K
Illumination situation: e.g. 1 operating surgeon/2 operating surgeons/large-surface wound/deep, narrow wound When the operating lamp 1 is used in a system of several operating lamps, there is the option to select whether the operating parameters are synchronized. In other words, when the color temperature of an operating lamp changes, for example, the color temperature of one or more further operating lamps is changed to the same value. This is useful for illuminating an operating field using several operating lamps. In an alternative setting, the operating parameters of the individual operating lamps can be separately changed, which may be useful If there are several operating fields.

Switching the sterile control element 6 off or on activates or deactivates the standby mode. The operating parameters are stored when it is switched off, but may still be displayed. When the operating lamp 1 is switched on, it assumes the operating state corresponding to the stored, last parameters.

Figure 2:
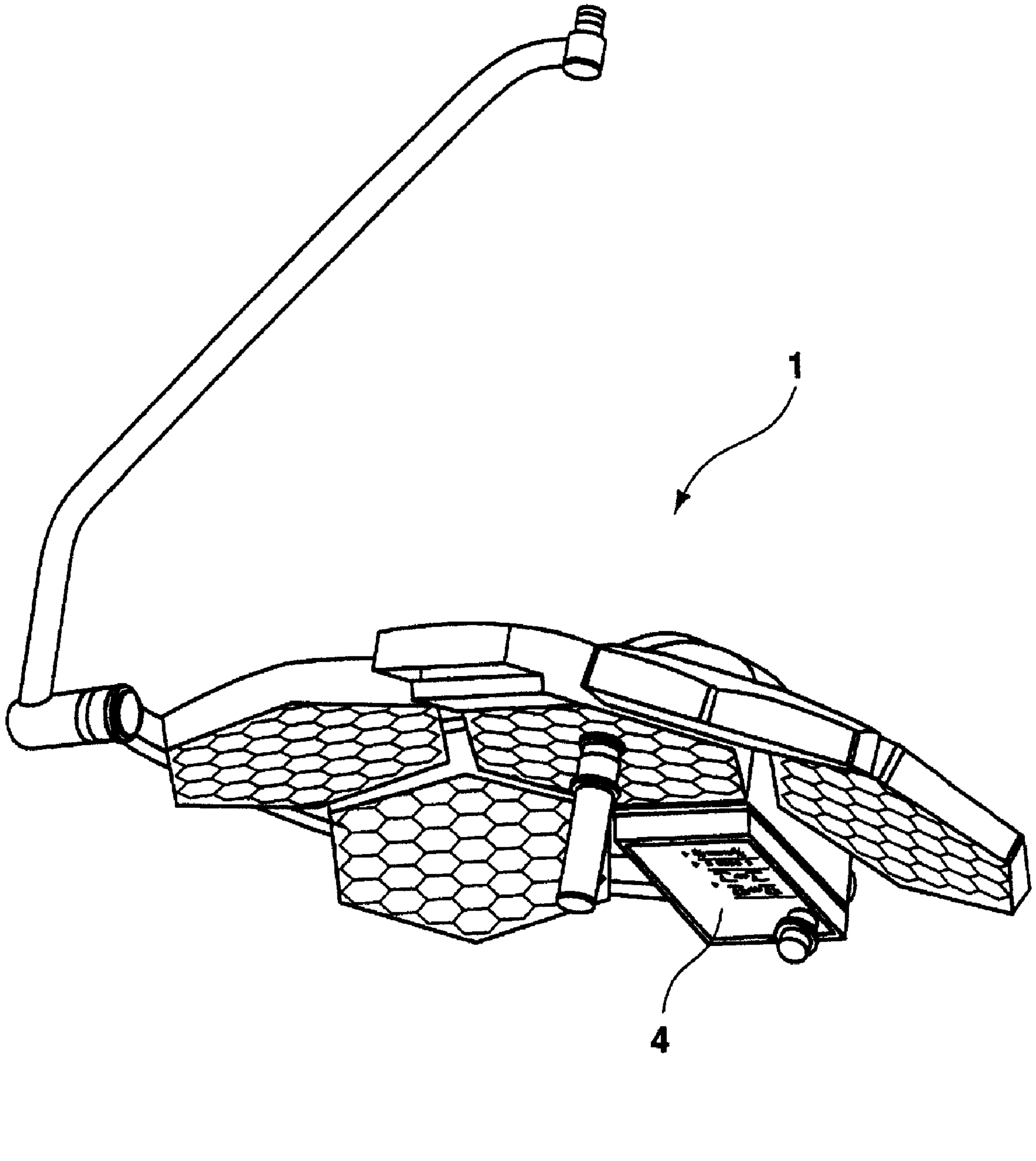
FIG. 2 shows a second operating lamp.

In accordance with FIG. 2, the operator controls 4 are disposed in the region of the light modules 2. The function of the operator controls 4 is the same. In both alternative arrangements of the operator controls 4 on the operating lamp 1, the operator controls 4 may be operated by the operating surgeon, since the arrangement is accessible for the operating surgeon. In accordance with FIG. 2, the operator controls 4 are disposed on the lower side of the operating lamp 1 associated with the operating field.

Figure 3:
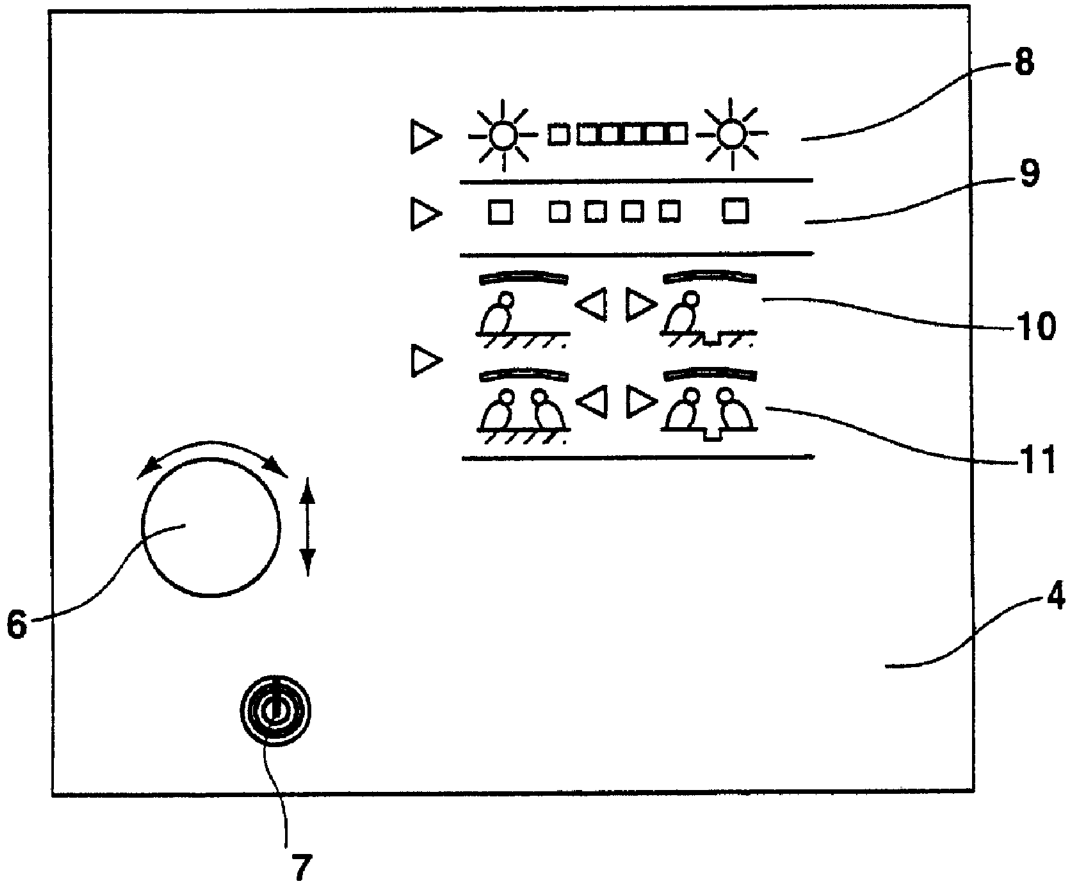
FIG. 3 shows an operating field of an operator controls for the first or second operating lamp.

In accordance with FIG. 3, the operator controls 4 include, in addition to the control element 6, a non-sterile switch 7 for completely switching the operating lamp off or on. When the operating lamp is switched on, it assumes the state corresponding to the predefined parameters (basic position). The operator controls 4 has a display 8 with several LEDs that shows the intensity of the adjusted brightness of the operating lamp, a display 9 with several LEDs that shows the intensity the of adjusted color temperature, a display 10 that shows the setting of the operating lamp for deep or shallow wounds, and a display 11 that shows the setting of the operating lamp within the illumination field for one or more operating surgeons.

A number of embodiments of the invention have been described. Nevertheless, it will be understood that various modifications may be made without departing from the spirit and scope of the invention. Accordingly, other embodiments are within the scope of the following claims.

The invention claimed is:

1. An operating lamp comprising:

one or more light modules;

operating parameter display fields configured to display adjustable parameters of operating states of the operating lamp, and a manipulable control element configured to allow a user to change the operating state of the operating lamp and, using the same control element, to adjust the adjustable parameters of the selected operating state;

wherein the control element emits a control signal configured to adjust the parameters in response to a first type of movement of the control element, and a control signal configured to change the operating state in response to a second type of movement of the control element, wherein the first type of movement is rotation of the control element about a longitudinal axis of the control element, and wherein the second type of movement is axial displacement.

2. The operating lamp of claim 1, wherein the operating states which the control element is manipulable to change include light intensity.

3. The operating lamp of claim 1, wherein the operating states which the control element is manipulable to change include emitted color temperature.

4. The operating lamp of claim 1, wherein the operating states which the control element is manipulable to change include distribution of light intensity at a light emitting surface of the lamp.

5. The operating lamp of claim 1, wherein the operating states which the control element is manipulable to change include switched-on and switched-off states.

6. The operating lamp of claim 1, comprising illuminants or light modules disposed adjacent the operator controls.

7. The operating lamp of claim 1, wherein the control element is removable.

8. The operating lamp of claim 1, wherein the control element is sterilizable.

9. An operating lamp comprising:

one or more light modules;

operating parameter display fields configured to display adjustable parameters of operating states of the operating lamp, and a manipulable control element configured to allow a user to change the operating state of the operating lamp and, using the same control element, to adjust the adjustable parameters of the selected operating state;

wherein the control element emits a control signal configured to adjust the parameters in response to a first type of movement of the control element, and a control signal configured to change the operating state in response to a second type of movement of the control element, wherein one of the first and second types of movement is axial displacement and the other of the first and second types of movement is rotation of the control element about a longitudinal axis of the control element.

10. The operating lamp of claim 9, comprising illuminants or light modules disposed adjacent the operator controls.

11. The operating lamp of claim 9, wherein the operating states which the control element is manipulable to change include light intensity.

12. The operating lamp of claim 9, wherein the operating states which the control element is manipulable to change include emitted color temperature.

13. The operating lamp of claim 9, wherein the operating states which the control element is manipulable to change include distribution of light intensity at a light emitting surface of the lamp.

14. The operating lamp of claim 9, wherein the operating states which the control element is manipulable to change include switched-on and switched-off states.

15. The operating lamp of claim 9, wherein the control element is removable.

16. The operating lamp of claim 9, wherein the control element is sterilizable.

17. An operating lamp comprising:

one or more light modules; and operator controls in operable communication with the one or more light modules, the operator controls comprising:

several operating parameter display fields for displaying adjustable parameters of individual operating states of the operating lamp, and a manipulable knob, wherein the manipulable knob is axially displaceable to switch between the individual operating states of the operating lamp, thereby allowing a user to select one of the individual operating states for adjustment, and wherein the manipulable knob is rotatable about a longitudinal axis of the knob to adjust the adjustable parameters of the selected operating state.

18. The operating lamp of claim 17, wherein the operating states which the manipulable knob is axially displaceable to switch between include light intensity, color temperature, and distribution of emitted light.

19. An operating lamp comprising:

one or more light modules; and operator controls in operable communication with the one or more light modules, the operator controls comprising:

several operating parameter display fields for displaying adjustable parameters of individual operating states of the operating lamp, and a manipulable knob, wherein the manipulable knob is rotatable about a longitudinal axis of the knob to switch between the individual operating states of the operating lamp, thereby allowing a user to select one of the individual operating states for adjustment, and wherein the manipulable knob is axially displaceable to adjust the adjustable parameters of the selected operating state.

20. The operating lamp of claim 19, wherein the operating states which the manipulable knob is axially displaceable to switch between include light intensity, color temperature, and distribution of emitted light.

* * * * *

UNITED STATES PATENT AND TRADEMARK OFFICE

CERTIFICATE OF CORRECTION

PATENT NO. : 7,746,009 B2
APPLICATION NO. : 11/459689
DATED : June 29, 2010
INVENTOR(S) : Fred Held, Kamran Tahbazian and Rudolf Marka It is certified that error appears in the above-identified patent and that said Letters Patent is hereby corrected as shown below:

On the title page in item [75]: under the inventors, please delete "Rudolf Marka, Ismauing (DE)" and insert --Rudolf Marka, Ismaning (DE)--.

Signed and Sealed this

Thirty-first Day of August, 2010

David J. Kappos

*Director of the United States Patent and Trademark Office*